(12) United States Patent
Brown et al.

(10) Patent No.: US 8,658,957 B2
(45) Date of Patent: Feb. 25, 2014

(54) SENSOR CIRCUIT AND DISPLAY APPARATUS

(75) Inventors: Christopher Brown, Oxford (GB); Hiromi Katoh, Osaka (JP); Kohei Tanaka, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 225 days.

(21) Appl. No.: 13/381,291

(22) PCT Filed: Jun. 23, 2010

(86) PCT No.: PCT/JP2010/060662
§ 371 (c)(1),
(2), (4) Date: Dec. 28, 2011

(87) PCT Pub. No.: WO2011/001874
PCT Pub. Date: Jan. 6, 2011

(65) Prior Publication Data
US 2012/0112047 A1    May 10, 2012

(30) Foreign Application Priority Data

Jun. 30, 2009  (JP) .................................. 2009-155349

(51) Int. Cl.
*H01L 27/00* (2006.01)
(52) U.S. Cl.
USPC ....................................... 250/208.1; 345/173
(58) Field of Classification Search
USPC ........... 250/214.1, 214 R, 208.1; 345/98, 173
See application file for complete search history.

(56) References Cited

U.S. PATENT DOCUMENTS

| 7,742,041 | B2 * | 6/2010 | Lee et al. ...................... 345/173 |
| 8,054,261 | B2 * | 11/2011 | Pak et al. ......................... 345/87 |
| 8,134,535 | B2 * | 3/2012 | Choi et al. ..................... 345/173 |
| 8,471,827 | B2 * | 6/2013 | Lee et al. ...................... 345/174 |

(Continued)

FOREIGN PATENT DOCUMENTS

| JP | 2006-3857 | 1/2006 |
| JP | 2006-133788 | 5/2006 |
| JP | 2006-238053 | 9/2006 |
| JP | 2009-128520 | 6/2009 |

OTHER PUBLICATIONS

Nakamura, T. et al. (2005). "Late-News Paper: A Touch Panel Function Integrated LCD Including LTPS A/D Converter," *SID 05 Digest* 1054-1055.

(Continued)

*Primary Examiner* — Seung C Sohn
(74) *Attorney, Agent, or Firm* — Morrison & Foerster LLP

(57) ABSTRACT

A sensor circuit or a display apparatus from which a highly accurate sensor output can be obtained includes a photodiode, a capacitor that is connected to the photodiode via an accumulation node and accumulates charges according to an electric current in the photodiode; a sensor switching element transistor that causes the accumulation node and an output line to be conductive with respect to each other in response to a readout signal and outputs an output signal according to the potential of the accumulation node to the output line; a variable capacitor that is provided between the accumulation node and an input electrode, and whose capacitance varies when a pressure is applied by a touching operation; and a control switching element transistor to which a control signal for switching conduction and non-conduction between the variable capacitor and the accumulation node is input.

7 Claims, 7 Drawing Sheets

(56) References Cited

U.S. PATENT DOCUMENTS

| | | |
|---|---|---|
| 2005/0045881 A1 | 3/2005 | Nakamura et al. |
| 2006/0017710 A1 | 1/2006 | Lee et al. |
| 2006/0097975 A1 | 5/2006 | Lee et al. |
| 2009/0002336 A1* | 1/2009 | Choi et al. .................... 345/174 |

OTHER PUBLICATIONS

Kim, N. D. et al. "Embedded Touch Screen Panel Technologies," FPD International 2008 Forum A-32, Oct. 31, 2008. 19 pages.

International Search Report mailed Aug. 31, 2010, directed to International Application No. PCT/JP2010/060662; 3 pages.

* cited by examiner

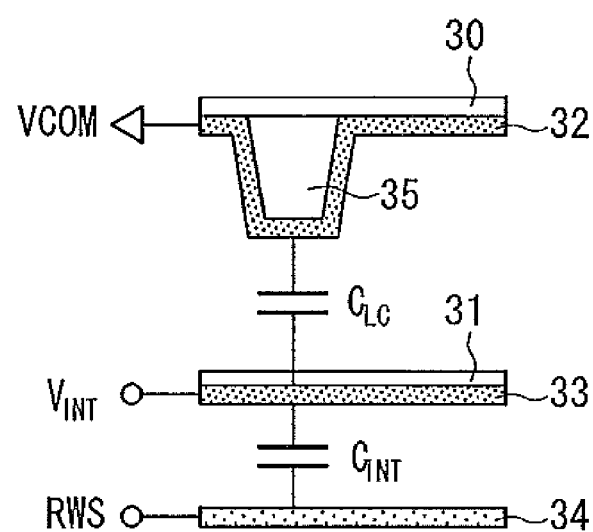
F I G. 4

SENSOR CIRCUIT AND DISPLAY APPARATUS

REFERENCE TO RELATED APPLICATIONS

This application is the national stage under 35 USC 371 of International Application No. PCT/JP2010/060662, filed Jun. 23, 2010, which claims the priority of Japanese Patent Application No. 2009-155349, filed Jun. 30, 2009, the entire contents of which are incorporated herein by reference.

TECHNICAL FIELD

The present invention relates to a sensor circuit provided with an optical sensor having a photodetecting element and a touch sensor, and to a display apparatus provided with the sensor circuits.

BACKGROUND ART

Conventionally, an optical-sensor-equipped display apparatus has been proposed that is provided with photodetecting elements such as photodiodes in its pixels and thereby is capable of detecting a brightness of external light and capturing an image of an object approaching its display panel. Such an optical-sensor-equipped display apparatus is supposed to be used as a display apparatus for two-way communication, or a display apparatus having a touch panel function.

In the case of a conventional optical-sensor-equipped display apparatus, when known composing elements such as signal lines and scanning lines, TFTs (thin film transistors), and pixel electrodes are formed through semiconductor processing, photodiodes and the like are formed on an active matrix substrate through the same processing (see JP 2006-3857 A, and "A Touch Panel Function Integrated LCD Including LTPS A/D Converter", T. Nakamura et al., SID 05 DIGEST, pp. 1054-1055, 2005).

Further, a display apparatus obtained by modifying the above-described optical-sensor-equipped display apparatus by adding a touch sensor so as to obtain outputs of two sensor systems has been known (see, for example, JP 2006-133788 A, and "FPD International 2008 Forum A-32", Latest Trends of Touch Panel Development, Korea, Samsung Electronics Co., Ltd., Nam Deog Kim et al., 2008).

SUMMARY OF THE INVENTION

With a circuit provided with an optical sensor and a touch sensor in combination as described above, it is difficult to obtain a highly accurate sensor output, due to problems such as sensor output variation caused by an inadvertent pressure applied to a touch panel.

It is an object of the present invention to provide a sensor circuit form which a highly accurate sensor output is obtained, the sensor circuit having a configuration in which an optical sensor and a touch sensor are used in combination.

In light of the above-described problems, a sensor circuit according to one embodiment of the present invention includes: a photodetecting element that receives incident light; an accumulation part that is connected to the photodetecting element via an accumulation node and accumulates charges according to an electric current having flown through the photodetecting element; a reset signal line to which a reset signal for initializing a potential of the accumulation node is supplied; a readout signal line to which a readout signal for outputting the potential of the accumulation node is supplied; a sensor switching element that is connected to between the accumulation node and an output line, so as to cause the accumulation node and the output line conductive with each other in response to the readout signal and output an output signal according to the potential of the accumulation node to the output line; a variable capacitor that is provided between the accumulation node and an input electrode to which a voltage is input, and whose capacitance varies when a pressure is applied; and a control switching element that is connected to the variable capacitance and the accumulation node, and has a control electrode to which a control signal for switching conduction and non-conduction between the variable capacitance and the accumulation node is input.

The present invention makes it possible to provide a sensor circuit that includes an optical sensor and a touch sensor, from which a highly accurate sensor output is obtained.

BRIEF DESCRIPTION OF DRAWINGS

FIG. 4 is a cross-sectional diagram showing a structure of a sensor circuit according to the present invention.

DETAILED DESCRIPTION OF THE INVENTION

Figure 1:
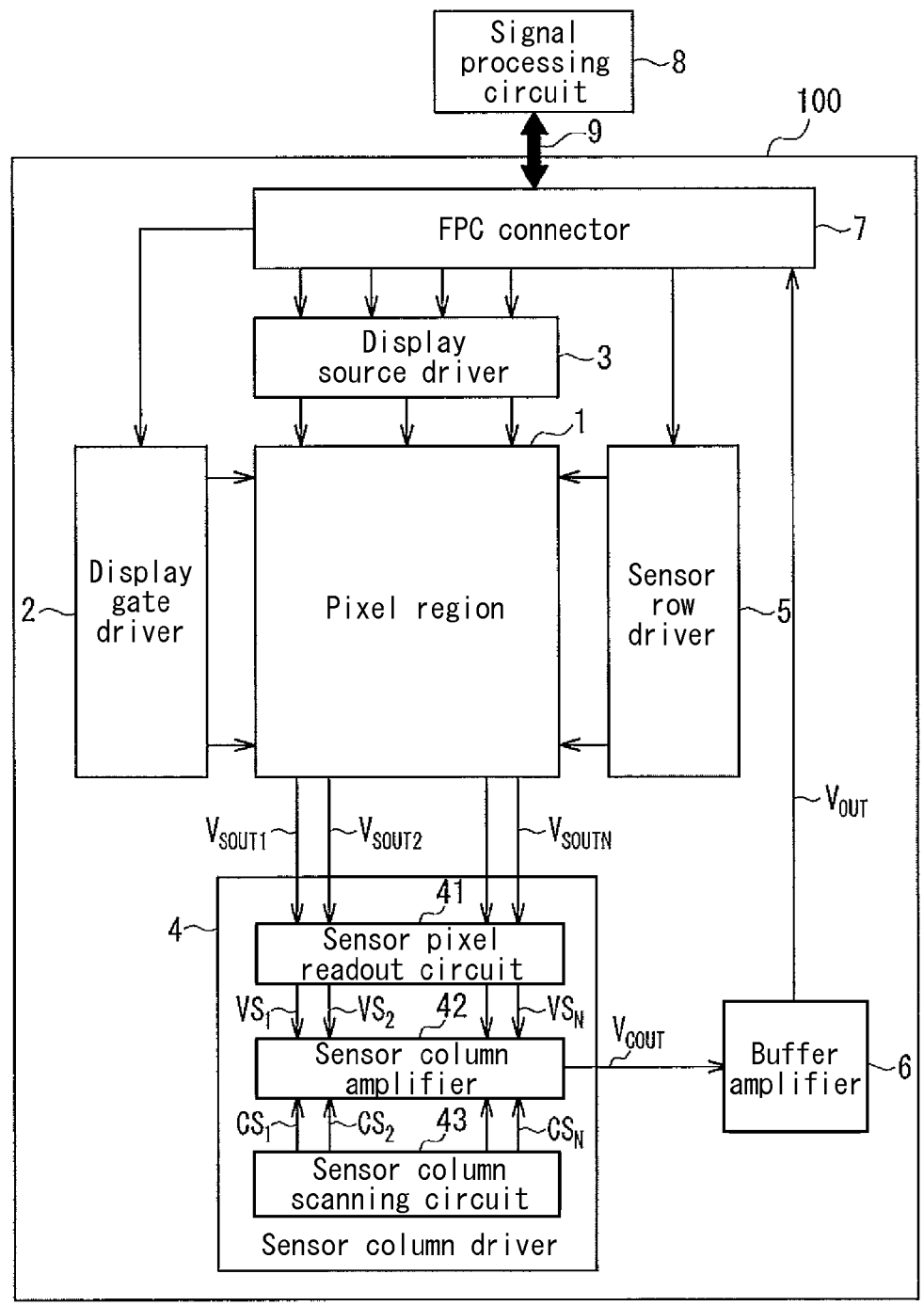
FIG. 1 is a block diagram showing a schematic configuration of a display apparatus according to one embodiment of the present invention.

A sensor circuit according to one embodiment of the present invention includes: a photodetecting element that receives incident light; an accumulation part that is connected to the photodetecting element via an accumulation node and accumulates charges according to an electric current having flown through the photodetecting element; a reset signal line to which a reset signal for initializing a potential of the accumulation node is supplied; a readout signal line to which a readout signal for outputting the potential of the accumulation node is supplied; a sensor switching element that is connected to between the accumulation node and an output line, so as to cause the accumulation node and the output line conductive with each other in response to the readout signal and output an output signal according to the potential of the accumulation node to the output line; a variable capacitor that is provided between the accumulation node and an input electrode to which a voltage is input, and whose capacitance varies when a pressure is applied; and a control switching element that is connected to the variable capacitor and the accumulation node, and has a control electrode to which a control signal for switching conduction and non-conduction between the variable capacitor and the accumulation node is input (first configuration).

With the above-described configuration, the conduction and the non-conduction between the variable capacitor and the accumulation node can be switched from one to the other by controlling the control switching element, whereby presence/absence of an output of the touch sensor based on a change in the capacitance of the variable capacitor can be switched from one to the other. Further, by adjusting the reset signal and the readout signal, the signal output from the photodetecting element can be stopped.

Therefore, with the above-described configuration in which the photodetecting element and the variable capacitor whose capacitance varies with a pressure applied by a touching operation are provided together, an output signal that is distinguishable as to whether the output is an output from the photodetecting element or an output due to a change in the capacitance of the variable capacitor can be output to the output line. In other words, by the sensor circuit having the above-described configuration, a highly accurate sensor output can be obtained that is distinguishable as to whether it is an output from the photodetecting element or an output due to a change in the capacitance of the variable capacitor.

A sensor circuit according to one embodiment of the present invention includes: a photodetecting element that receives incident light; an accumulation part that accumulates a potential according to an electric current flowing through the photodetecting element, in an accumulation node; a reset signal line to which a reset signal for initializing a potential of the accumulation node is supplied; a readout signal line to which a readout signal for reading out the potential of the accumulation node is supplied; a sensor switching element that reads out the potential of the accumulation node in response to the readout signal and outputs an output signal according to the potential; a variable capacitor whose capacitance varies with a pressure applied thereto; and a control switching element that controls conduction and non-conduction between the variable capacitor and the accumulation node, wherein the sensor circuit operates in at least two operation modes among an imager mode, a touch mode, and a hybrid mode, wherein in the imager mode, the potential of the accumulation node depends on an electric current that has flown through the photodetecting element during a period from the initialization by the reset signal to the readout in response to the readout signal; in the touch mode, the potential of the accumulation node depends on a capacitance of the variable capacitor upon the readout; and in the hybrid mode, the potential of the accumulation node depends on both of the electric current having flown through the photodetecting element and the capacitance of the variable capacitor (second configuration).

With the above-describe configuration, the sensor circuit can be caused to operate selectively in at least two modes among the three modes. Therefore, in the configuration including the photodetecting element and the variable capacitor, the sensor output can be switched by switching the operation mode. Therefore, a more highly accurate sensor output can be obtained.

In the second configuration, it is preferable that in the imager mode, a voltage of the reset signal is set so that charges according to the electric current having flown through the photodetecting element are accumulated in the accumulation part during the period from the initialization of the accumulation node by the reset signal to the readout in response to the readout signal; and the control switching element is controlled so that it is non-conductive at least upon the readout (third configuration).

With this, the potential of the accumulation node has a value according to an electric current having flown through the photodetecting element. Therefore, an output signal output from the sensor switching element becomes a signal corresponding to an output of the photodetecting element. Therefore, in the imager mode, the sensor output from the photodetecting element does not change even in the case where the touch panel is pressed inadvertently. As a result, a highly accurate sensor output is obtained.

In the second configuration, it is preferable that in the touch mode, a voltage of the reset signal is set so that the accumulation node assumes an initialized state upon the readout; and the control switching element is controlled so that it is conductive upon the readout (fourth configuration).

This makes it possible to make the photodetecting element ineffective upon readout, and to cause a capacitance of the variable capacitor, which varies with a pressure applied by a touching operation, to be reflected on the potential of the accumulation node via the control switching element. Therefore, a result of detection by the variable capacitor upon a touching operation can be outputted accurately as a sensor output.

In the second configuration, it is preferable that in the hybrid mode, the control switching element is controlled so that the control switching element is conductive upon the readout; a voltage of the reset signal is set so that charges according to the electric current having flown through the photodetecting element are accumulated in the accumulation part during the period from the initialization of the accumulation node by the reset signal to the readout in response to the readout signal; and in the case where the variable capacitor is made conductive with the accumulation node by the control switching element upon the readout, a voltage is applied to the variable capacitor so that the accumulation node has a predetermined voltage (fifth configuration).

With this configuration, the potential of the accumulation node has a value depending on an electric current having flown through the photodetecting element and a capacitance of the variable capacitor. As a result, both of the detection results of the photodetecting element and the variable capacitor can be output as a sensor output.

A display device according to one embodiment of the present invention preferably includes an active matrix substrate having a pixel region, and a counter substrate, wherein the sensor circuit according to any one of claims 1 to 5 is provided in the pixel region of the active matrix substrate (sixth configuration).

Hereinafter, a more specific embodiment of the present invention is explained with reference to the drawings. It should be noted that the following embodiment shows an exemplary configuration in the case where a display apparatus according to the present invention is embodied as a liquid crystal display device, but the display apparatus according to the present invention is not limited to a liquid crystal display device, and is applicable to an arbitrary display apparatus in which an active matrix substrate is used. It should be noted that a display apparatus according to the present invention, as having optical sensors, is assumed to be used as a touchpanel-equipped display device that detects an object approaching its screen and carries out an input operation, a display apparatus for two-way communication having a display function and an image pickup function, etc.

Further, the drawings referred to hereinafter show, in a simplified manner, only principal members needed for explanation of the present invention among composing members of the embodiment of the present invention, for convenience of explanation. Therefore, a display apparatus according to the present embodiment may include arbitrary members that are not shown in the drawings that the present specification refers to. Further, the dimensions of the members shown in the drawings do not faithfully reflect actual dimensions of composing members, dimensional ratios of the members, etc.

Embodiment

First, a configuration of an active matrix substrate provided in a liquid crystal display device according to one embodiment of the present invention is explained with reference to FIGS. 1 and 2.

FIG. 1 is a block diagram illustrating a schematic configuration of an active matrix substrate 100 provided in a liquid crystal display device according to one embodiment of the present invention. As shown in FIG. 1, the active matrix substrate 100 includes, on its glass substrate, at least a pixel region 1, a display gate driver 2, a display source driver 3, a sensor column driver 4, a sensor row driver 5, a buffer amplifier 6, and an FPC (flexible printed circuit) connector 7. Further, a signal processing circuit 8 for processing an image signal captured by a photodetecting element (to be described later) and/or a switching element (to be described later) in the pixel region 1 is connected to the active matrix substrate 100 via the FPC connector 7 and an FPC 9.

It should be noted that the above-described members on the active matrix substrate 100 may be formed monolithically on the glass substrate through semiconductor processing. Alternatively, the configuration may be as follows: the amplifiers and drivers among the above-described members may be mounted on the glass substrate by, for example, COG (chip on glass) techniques. Further alternatively, at least a part of the aforementioned members shown on the active matrix substrate 100 in FIG. 1 may be mounted on the FPC 9. The active matrix substrate 100 is laminated with a counter substrate (not shown) having a counter electrode formed over an entire surface thereof. A liquid crystal material is sealed in the space between the active matrix substrate 100 and the counter substrate.

The pixel region 1 is a region where a plurality of pixels are formed for displaying images. In the present embodiment, an optical sensor for capturing images is provided in each pixel in the pixel region 1. FIG. 2 is an equivalent circuit diagram showing an arrangement of sensor circuits (optical sensors and touch sensors) in the pixel region in the active matrix substrate 100. In the example shown in FIG. 2, one pixel is formed with three primary color dots of R (red), G (green), and B (blue). In one pixel composed of these three color dots, there is provided one sensor circuit composed of a photodiode D1, a capacitor $C_{INT}$, a thin-film transistor M2, a thin-film transistor M4, and a capacitor $C_{LC}$. The pixel region 1 includes the pixels arrayed in a matrix of M rows×N columns, and the sensor circuits arrayed likewise in a matrix of M rows×N columns. It should be noted that the number of the color dots is M×3N.

Therefore, the pixel region 1 has gate lines GL and source lines COL arrayed in matrix as lines for pixels. The gate lines GL are connected with the display gate driver 2. The source lines COL are connected with the display source driver 3. It should be noted that M rows of the gate lines GL are provided in the pixel region 1. Hereinafter, when an individual gate line GL needs to be described distinctly, it is denoted by GLi (i=1 to M). On the other hand, three source lines COL are provided per one pixel so as to supply image data to three color dots in the pixel, as described above. When an individual source line COL needs to be described distinctly, it is denoted by COLrj, COLgj, or COLbj (j=1 to N).

At each of intersections of the gate lines GL and the source lines COL, a thin-film transistor (TFT) M1 is provided as a switching element for a pixel. It should be noted that the thin film transistors M1 provided for color dots of red, green, and blue are denoted by M1r, M1g, and M1b, respectively. A gate electrode of the thin-film transistor M1 is connected to the gate line GL, a source electrode thereof is connected to the source line COL, and a drain electrode thereof is connected to a pixel electrode, which is not shown.

For a color dot driven by a thin-film transistor M1r connected to an intersection of one gate line GLi and one source line COLrj, a red color filter is provided so as to correspond to this color dot. This color dot is supplied with image data of red color from the display source driver 3 via the source COLrj, thereby functioning as a red color dot. Further, for a color dot driven by a thin-film transistor M1g connected to an intersection of the gate line GLi and the source line COLgj, a green color filter is provided so as to correspond to this color dot. This color dot is supplied with image data of green color from the display source driver 3 via the source line COLgj, thereby functioning as a green color dot. Still further, for a color dot driven by a thin-film transistor M1b connected to an intersection of the gate line GU and the source line COLbj, a blue color filter is provided so as to correspond to this color dot. This color dot is supplied with image data of blue color from the display source driver 3 via the source line COLbj, thereby functioning as a blue color dot.

Figure 2:
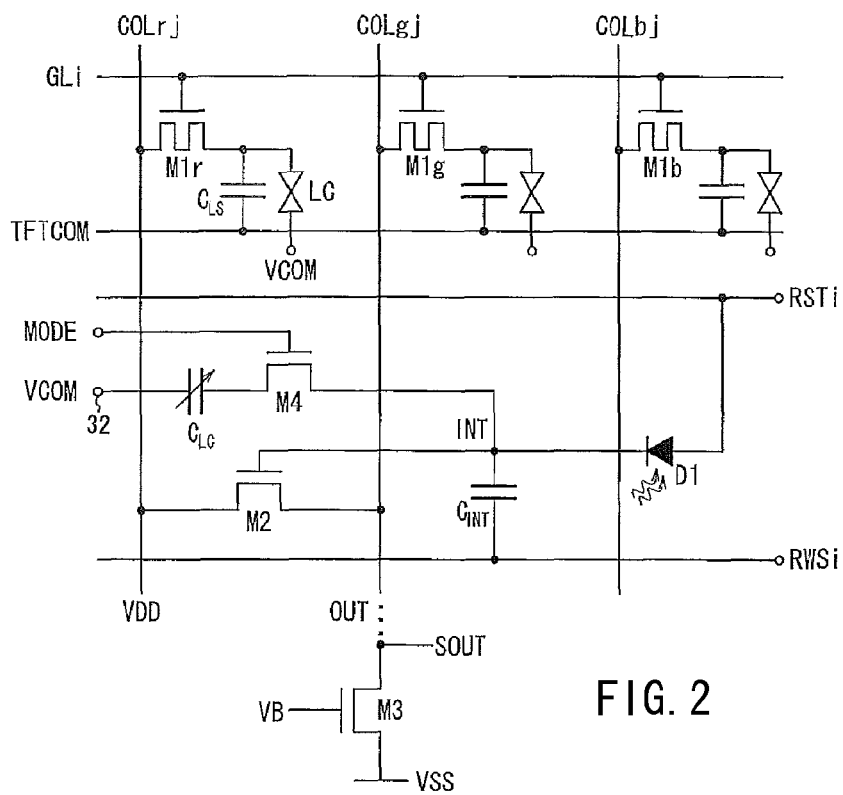
FIG. 2 is an equivalent circuit diagram showing a configuration of one pixel in a display apparatus according to one embodiment of the present invention.

It should be noted that in the example shown in FIG. 2, sensor circuits are provided so that one sensor circuit corresponds to one pixel (three color dots) in the pixel region 1. The ratio between the pixels and the sensor circuits provided, however, is not limited to this example, but is arbitrary. For example, one sensor circuit may be provided per one color dot, or one sensor circuit may be provided per a plurality of pixels.

Figure 3:
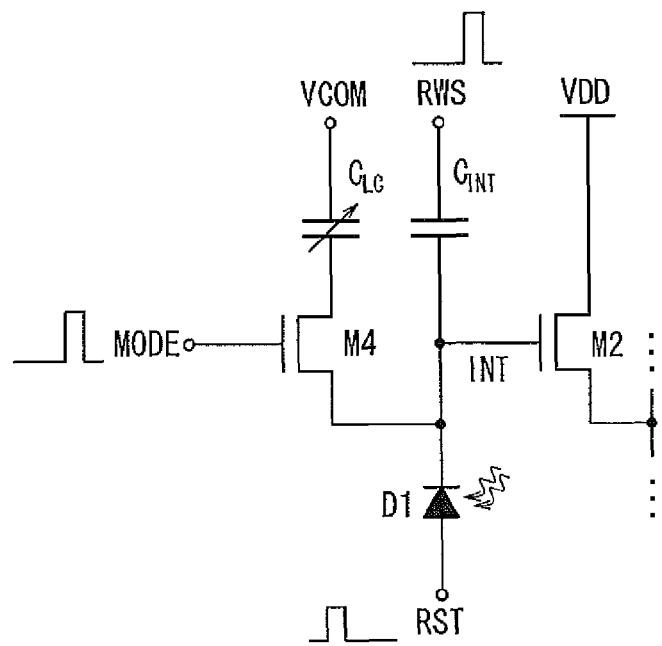
FIG. 3 is a circuit diagram showing a sensor circuit in a display apparatus according to one embodiment of the present invention.

FIG. 3 is an equivalent circuit diagram showing exclusively a sensor circuit part of the circuit shown in FIG. 2. The sensor circuit includes, as shown in FIG. 3, the photodiode D1, the capacitor $C_{INT}$, the thin-film transistor M2, the thin-film transistor M4, and the capacitor $C_{LC}$ as a variable capacitor. The photodiode D1 is an exemplary photodetecting element that receives incident light. It should be noted that a PN-junction diode or a PIN junction diode having a lateral structure or a laminate structure, for example, can be used as the photodiode D1.

The capacitor $C_{INT}$ (accumulation part) is connected to the photodiode D1 via an accumulation node INT, and accumulates charges according to an electric current having flown through the photodiode D1. To an anode of the photodiode D1, a line RST for supplying a reset signal (an exemplary reset signal line) is connected. With the reset signal supplied to the line RST, the potential $V_{INT}$ of the accumulation node INT is initialized via the photodiode D1. A line RWS as an exemplary readout signal line is connected to the accumulation node INT via the capacitor $C_{INT}$. Through this line RWS, a readout signal for outputting the potential $V_{INT}$ of the accumulation node INT is supplied to the accumulation node INT.

A gate, a drain, and a source of the transistor M2 are connected to the accumulation node INT, a line VDD, and a line OUT (an exemplary output line), respectively. Thus, the transistor M2 is connected to between the accumulation node INT and the line OUT. The transistor M2 is a sensor switching element that allows the accumulation node INT and the line OUT to be conductive with each other in response to the readout signal, thereby causing an output signal according to a potential of the accumulation node INT to be output to the line OUT.

The capacitor $C_{LC}$ is provided between the accumulation node INT and an input electrode (counter electrode 32) connected to an electrode VCOM that supplies a voltage as a reference. This capacitor $C_{LC}$ is a variable capacitor whose capacitance varies when it is pressed by a touch operation. The transistor M4 (control switching element) is connected to between the capacitor $C_{LC}$ and the accumulation node INT. In other words, a drain, a source, and a gate (control electrode) of the transistor M4 are connected to the accumulation node INT, the capacitor $C_{LC}$, and a line MODE, respectively. The line MODE supplies, to the gate of the transistor M4, a control signal for switching conduction and non-conduction between the capacitor $C_{LC}$ and the accumulation node INT from one to the other. With this control signal, the operation mode of the optical sensor circuit is controlled (details of the same will be described later).

Thus, in the present embodiment, the transistor M4 for controlling conduction is provided between the capacitor $C_{LC}$ for detecting a touch operation and the accumulation node INT, so that a decrease in sensitivity of the sensor circuit as the optical sensor can be suppressed, as will be described later. Besides, the aforementioned configuration makes it easier to distinguish a pressure detection by the liquid crystal capacitor (capacitor $C_{LC}$) and an output by the optical sensor (photodiode D1), as will be described later. Therefore, it is possible to realize the detection of a feather touch (a light touch that cannot be detected based on a change in the capacitance of the capacitor $C_{LC}$ caused by a pressing operation) by the optical sensor and the detection of a pressure based on a change in the capacitance of the capacitor $C_{LC}$, at the same time.

It should be noted that, in the example shown in FIG. 2, the source line COLr also functions as the line VDD for supplying a constant voltage VDD to the optical sensor from the sensor column driver 4. Further, the source line COLg also functions as the line OUT for outputting a sensor output.

Here, an exemplary structure of the capacitor $C_{LC}$ is explained. As described above, one of the electrodes of the capacitor $C_{LC}$ is connected to the accumulation node INT via the transistor M4, and the other electrode of the capacitor $C_{LC}$ is connected to the electrode VCOM. FIG. 4 is a cross-sectional view that schematically illustrates a structure of the capacitor $C_{INT}$ and the capacitor $C_{LC}$. In the example shown in FIG. 4, the capacitor $C_{LC}$ includes the counter electrode 32 on a side to a counter substrate 30, and an electrode 33 on a side to an active matrix substrate 31 opposed to the counter electrode 32. On the counter substrate 30, a sub-photo spacer 35 is formed. The counter electrode 32 is provided in such a manner as to cover the sub-photo spacer 35. The electrode 33 is located at a position opposed to the sub-photo spacer 35, on the active matrix substrate 31. The electrode 33 is one of electrodes of the capacitor $C_{LC}$ and is connected to the accumulation node INT. The counter electrode 32 is equivalent to the other electrode of the capacitor $C_{LC}$. The capacitance of the capacitor $C_{LC}$ varies with the distance between the counter electrode 32 and the electrode 33. In other words, when the counter substrate 30 is pressed by a touch operation and the distance between the counter electrode 32 and the electrode 33 changes, the capacitance of $C_{LC}$ changes. The electrode 33 is one of the electrodes of the capacitor $C_{INT}$, and the electrode 34 is equivalent to the other electrode of the capacitor $C_{INT}$. This electrode 34 is connected to the line RWS.

The lines RST and RWS are connected to the sensor row driver 5. These lines RST and RWS are provided per each row. Therefore, hereinafter, when the lines should be distinguished, they are denoted by RSTi and RWSi (i=1 to M).

The sensor row driver 5 selects the lines RSTi and RWSi in combination shown in FIG. 2 sequentially at predetermined time intervals ($t_{row}$). With this, the rows of the optical sensors from which signal charges are to be read out are selected sequentially in the pixel region 1.

In the configuration of FIG. 2, the reset signal and the readout signal are supplied to the line RST and the line RWS at predetermined timings, respectively, whereby a sensor output $V_{PIX}$ according to an amount of light received by the photodiode D1 can be obtained. It should be noted that, as shown in FIG. 2, a drain of an insulated gate field effect transistor M3 is connected to an end of the line OUT. A potential $V_{SOUT}$ of this drain of the transistor M3 is output to the sensor column driver 4 as an output signal from the optical sensor. A source of the transistor M3 is connected to the line VSS. A gate of the transistor M3 is connected to a reference voltage power source (not shown) via a reference voltage line VB.

Next, an operation of the sensor circuit shown in FIG. 2 is explained. The sensor circuit according to the present embodiment is able to operate in three modes. The first one is an operation mode in which both of the optical sensor and the touch sensor function (hybrid mode), the second one is an operation mode in which only the optical sensor functions (imager mode), and the third one is an operation mode in which only the touch sensor functions (touch mode). These three modes can be switched from one to an arbitrary mode among these by controlling the above-described transistor M4 and the reset signal. Hereafter, each operation mode is explained.

1. Hybrid Mode

A sensor circuit that causes the capacitor $C_{LC}$ and the photodiode D1 to function is explained as an exemplary hybrid mode. In FIG. 2, when a voltage is supplied to the line MODE, the transistor M4 thereby becomes conductive.

Figure 5:
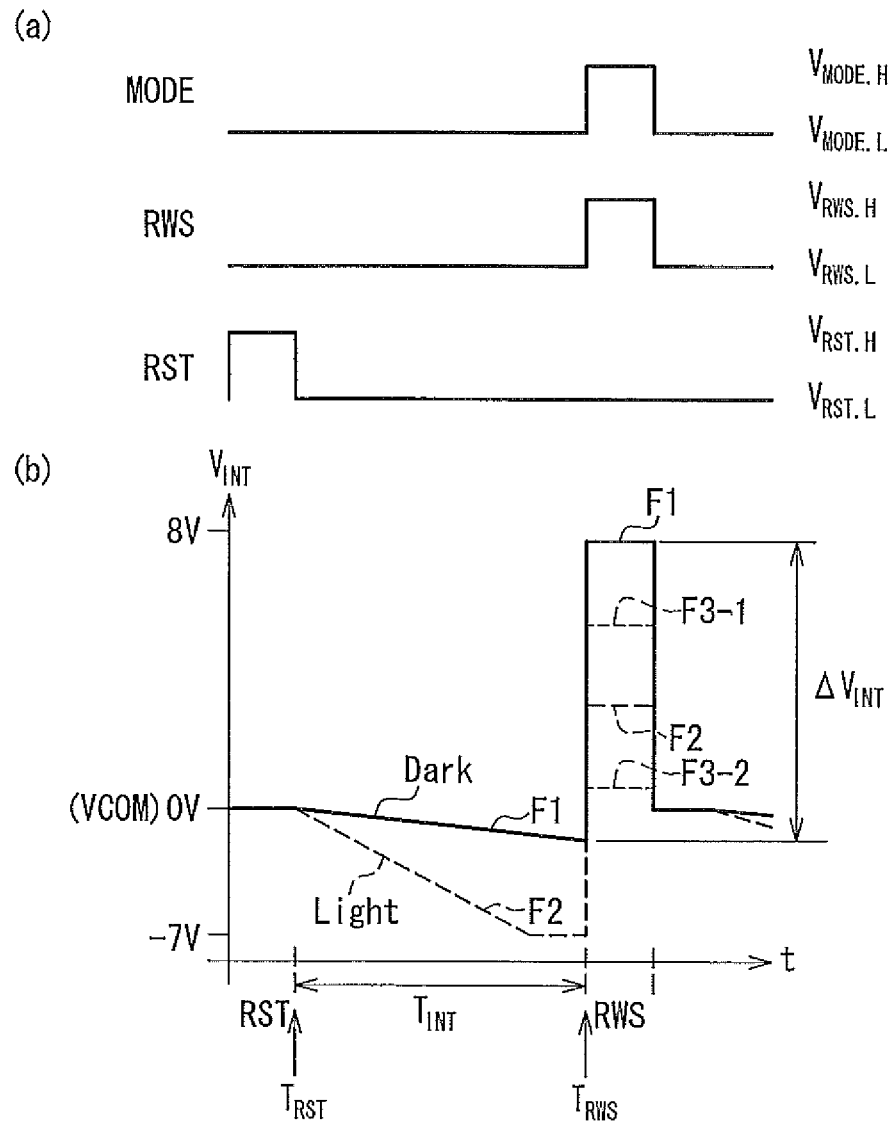
FIG. 5(a) is a waveform diagram showing a relationship between input signals (signals of a line RST, a line RWS, and a line MODE) and $V_{INT}$ in a sensor circuit according to one embodiment of the present invention.
FIG. 5(b) is a waveform diagram showing variation of the potention $V_{INT}$ of the accumulation node INT of the embodiment of FIG. 5(a).

(a) of FIG. 5 is a waveform diagram of input signals (respective signals of the line RST, the line RWS, and the line MODE) in the sensor circuit according to the present embodiment. (b) of FIG. 5 is a waveform diagram showing variation of the potential $V_{INT}$ of the accumulation node INT. In the example shown in (a) of FIG. 5, after a sensing period (integration period $T_{INT}$) that follows a reset period while a reset voltage at a high level, $V_{RST.H}$, is applied to the line RST, a readout voltage at a high level, $V_{RWS.H}$, is applied to the line RWS. At the same time when this high-level voltage $V_{RWS.H}$ is supplied to the line RWS, a high-level voltage $V_{MODE.H}$ is applied also to the line MODE. With this, a change in the potential of the accumulation node during the integration period $T_{INT}$ can be amplified and read out.

When a reset signal at a high level, $V_{RST.H}$, is supplied to the line RST, the photodiode D1 is forward-biased, and the potential $V_{INT}$ of the accumulation node INT (potential of the gate of the transistor M2) is expressed by the following formula (1):

$$V_{INT} = V_{RST.H} - V_F \qquad (1)$$

In the formula (1), $V_F$ represents a forward voltage of the photodiode D1. Since $V_{INT}$ herein is lower than the threshold voltage of the transistor M2, the transistor M2 is non-conductive during a period after the reset.

Next, when the reset signal returns to a low level $V_{RST.L}$ (at a timing of $t=T_{RST}$ in (b) of FIG. 5), an electric current integration period (a sensing period after the supply of the reset signal before the supply of the readout signal, i.e., a period denoted by $T_{INT}$ shown in (b) of FIG. 5) starts. During the integration period, an electric current proportional to an amount of light incident on the photodiode D1 flows out of the capacitor $C_{INT}$, thereby discharging the capacitor $C_{INT}$. Thus, the potential $V_{INT}$ of the accumulation node INT at the end of the integration period is expressed by the following formula (2):

$$V_{INT}=V_{RST.H}-V_F-\Delta V_{RST}\cdot C_{PD}/C_T-I_{PHOTO}\cdot T_{INT}/C_T \quad (2)$$

In the formula (2), $\Delta V_{RST}$ represents a height of a pulse of the reset signal ($V_{RST.H}-V_{RST.L}$), $I_{PHOTO}$ represents an electric current value of the photoelectric current of the photodiode D1, and $T_{INT}$ represents a duration of the integration period. $C_{PD}$ represents a capacitance of the photodiode D1. $C_T$ represents a sum of a capacitance of the capacitor $C_{INT}$, the capacitance $C_{PD}$ of the photodiode D1, and a capacitance $C_{TFT}$ of the transistor M2. During the integration period also, since the $V_{INT}$ is lower than the threshold voltage of the transistor M2, the transistor M2 is non-conductive. After the integration period, as shown in (b) of FIG. 5, when the readout signal rises at the timing $T_{RWS}$, the readout period thereby starts. It should be noted that the readout period continues while the readout signal of the line RWS remains at the high level. Further, a mode control signal of the line MODE rises at the same time when the readout signal rises, and the mode control signal continuously remains at a high level while the readout signal remains at the high level. In other words, during the readout period, since the mode control signal rises, the transistor M4 is conductive.

Here, upon the supply of the readout signal, injection of electric charges to the capacitor $C_{INT}$ and the capacitor $C_{LC}$ occurs. As a result, the potential $V_{INT}$ of the accumulation node INT becomes a potential expressed by the following formula (3):

$$V_{INT}=V_{RST.H}-V_F-\Delta V_{RST}\cdot C_{PD}/C_T-I_{PHOTO}\cdot T_{INT}/C_T+\Delta V_{RWS}\cdot C_{INT}/C_T+C_{IC}) \quad (3)$$

$\Delta V_{RWS}$ is a height of a pulse of the readout signal ($V_{RWS.H}-V_{RWS.L}$). With this, the potential $V_{INT}$ of the accumulation node INT becomes higher than the threshold voltage, and this causes the transistor M2 to become conductive. Thus, the transistor M2, together with the bias transistor M3 provided at an end of the line OUT in each column, functions as a source-follower amplifier. In other words, during the readout period, since the transistor M4 is conductive, a capacitance of the capacitor $C_{LC}$ upon the readout also, in addition to the integral of a photoelectric current of the photodiode D1, is reflected on the voltage $V_{INT}$ of the capacitor accumulation node INT upon the readout. As a result, the sensor output voltage $V_{PIX}$ from the transistor M2 has a value corresponding to the integral of the photoelectric current of the photodiode D1 during the integration period and the capacitance of the capacitor $C_{LC}$ upon the readout. Thus, in the present embodiment, the potential $V_{INT}$ of the accumulation node is boosted up by the readout signal of the line RWS, and at the same time, the transistor M4 is controlled so as to be turned on. With this, the capacitance of the capacitor $C_{LC}$ is reflected on the potential $V_{INT}$ upon the readout.

In (b) of FIG. 5, the waveform F1 indicated by the solid line represents variation of $V_{INT}$ in the case where light incident on the photodiode D1 is small in amount, and the waveform F2 indicated by the broken line represents variation of the potential $V_{INT}$ in the case where light at a saturation level is incident on the photodiode D1. The waveform F3-1 indicated by a dotted line during the readout period is a waveform in the case where a touching operation is carried out and light incident on the photodiode D1 is small in amount. The waveform F3-2 indicated by a dotted line during the readout period is a waveform in the case where a touching operation is carried out and light at a saturation level is incident on the photodiode D1. $\Delta V_{INT}$ is an amount by which the potential $V_{INT}$ is boosted when the readout signal from the line RWS is applied to the sensor circuit during the readout period.

As described above, in the present embodiment, the initialization with the reset pulse, the integration of an electric current during the integration period, and the readout of a sensor output during the readout period, which are assumed to constitute one cycle, are performed cyclically. By doing so, the sensor output timing can be controlled, whereby outputs of the sensor circuit at each pixel can be obtained accurately.

It should be noted that the voltage of VCOM is preferably set so as not to fluctuate during the period while the readout signal of the line RWS is at a high level.

2. Imager Mode

As to the imager mode, a sensor circuit that causes only the photodiode D1 to function is explained as an example. In order to cause only the photodiode D1 to function, the transistor M4 is kept non-conductive by control for not supplying a high-level voltage to the line MODE (i.e., by keeping a state where $V_{MODE.L}$ is supplied), as shown in (a) of FIG. 6.

When the readout signal is supplied from the line RWS, charge injection to the capacitor $C_{INT}$ occurs. As a result, the potential $V_{INT}$ of the accumulation node INT becomes a potential expressed by the aforementioned formula (3). Like the "hybrid mode" described above, the potential $V_{INT}$ becomes higher than the threshold voltage by $\Delta V_{RWS}$, thereby making the transistor M2 conductive. Thus, the transistor M2, together with the bias transistor M3 provided at an end of the line OUT in each column, functions as a source follower amplifier.

Figure 6:
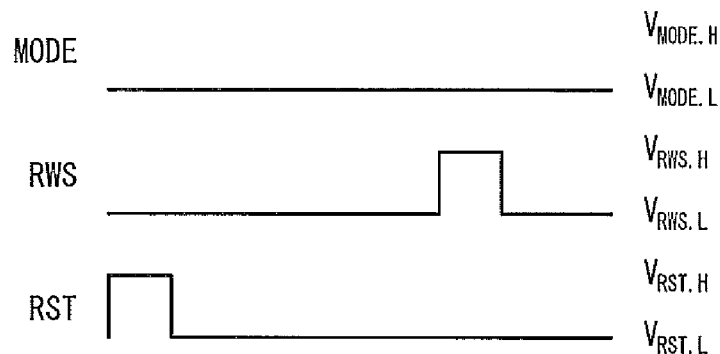
FIG. 6(a) is a waveform diagram showing a relationship between input signals (signals of a line RST, a line RWS, and a line MODE) and $V_{INT}$ in a sensor circuit according to one embodiment of the present invention.
FIG. 6(b) depicts waveform F1 as a solid line representing variation of the potential $V_{INT}$ in a non-touched state and in the case where light incident on the photodiode D1 is small in amount.
Figure 6:
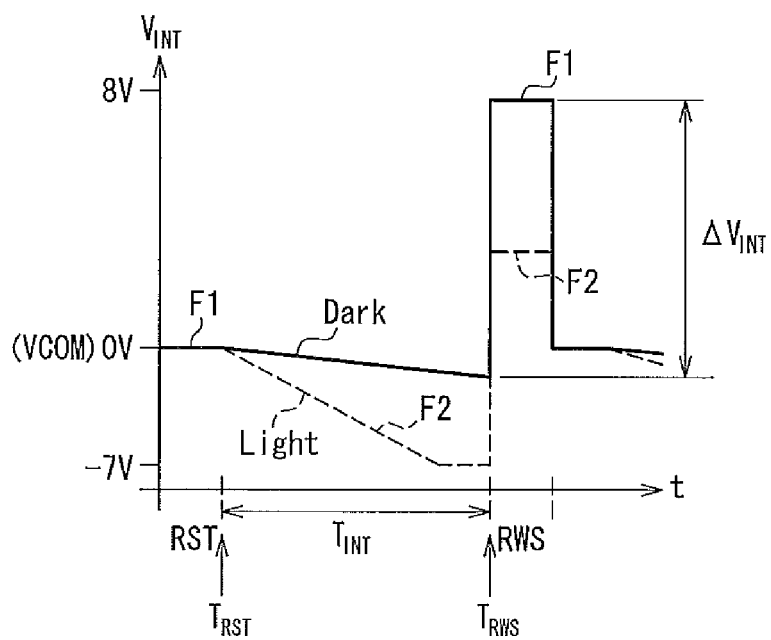

In (b) of FIG. 6, the waveform F1 indicated by the solid line represents variation of the potential $V_{INT}$ in a non-touched state and in the case where light incident on the photodiode D1 is small in amount. The waveform F2 indicated by the broken line represents variation of the potential $V_{INT}$ in a non-touched state and in the case where light at a saturation level is incident on the photodiode D1.

During the readout period, therefore, an integral of the photoelectric current of the photodiode D1 is reflected on the voltage $V_{INT}$. As a result, the sensor output voltage $V_{PIX}$ from the transistor M2 has a value corresponding to the integral of the photoelectric current of the photodiode D1 during the integration period.

3. Touch Mode

Figure 7:
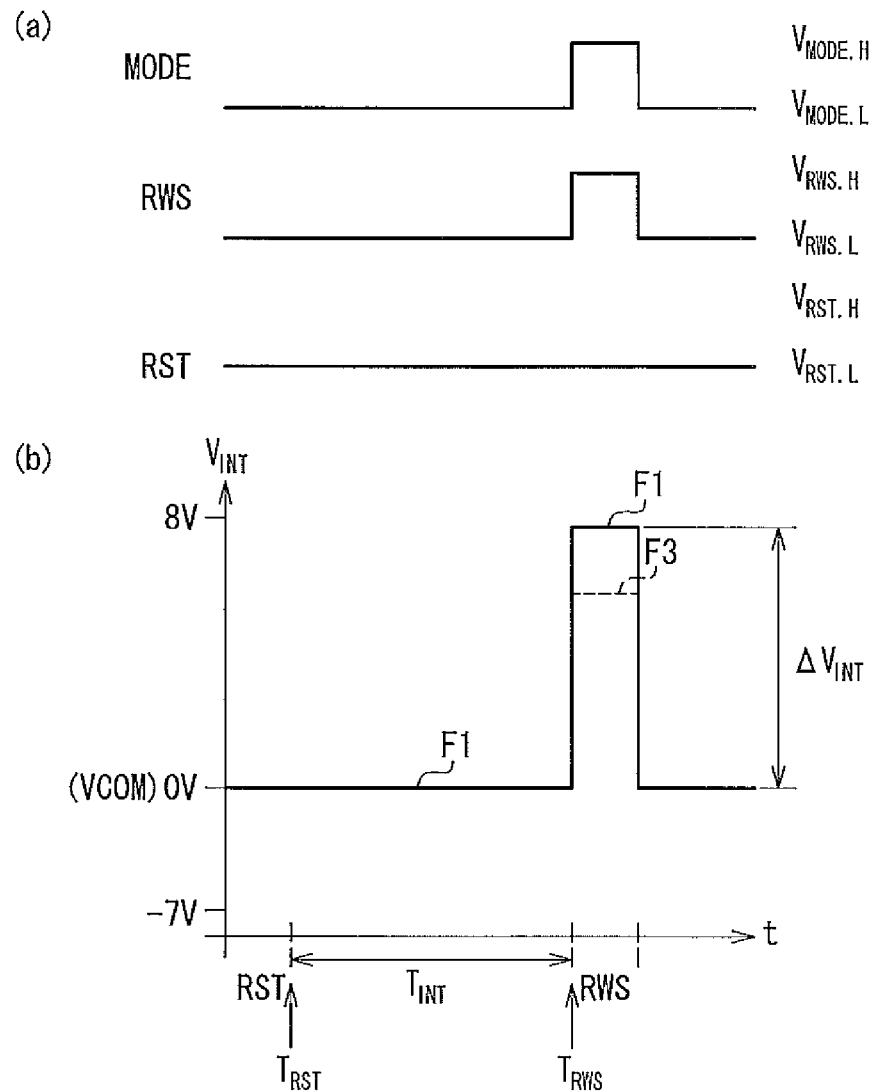
FIG. 7(a) is a waveform diagram showing a relationship between input signals (signals of a line RST, a line RWS, and a line MODE) and $V_{INT}$ in a sensor circuit according to one embodiment of the present invention.
FIG. 7(b) depicts waveform F1 indicated by the solid line representing variation of the potential $V_{INT}$ in a touched state.

As to the touch mode, a sensor circuit that causes the photodiode D1 not to function is explained as an example. As a method for preventing a forward voltage of the photodiode D1 from being generated, the low level $V_{RST.L}$ and the high level $V_{RST.H}$ of the reset signal may be set to the same voltage. For example, as shown in (a) of FIG. 7, a DC power source of 0 V may be used for the reset signal, whereby the photodiode D1 can be made ineffective. It should be noted that the photodiode D1 may be made ineffective by supplying the readout signal immediately after the supply of the reset signal so as to use the timing when a forward voltage of the photodiode D1 is not generated as the readout period.

In this case, the transistor M4 is turned on by supplying the readout signal to the line RWS and at the same time, supplying the mode control signal to the line MODE, as is the case with the above-described "hybrid mode".

As is the case with the "hybrid mode" described above, the potential $V_{INT}$ of the gate of the transistor M2 is made higher than the threshold voltage, whereby the transistor M2 becomes conductive. As a result, the transistor M2, together with the bias transistor M3 provided at an end of the line OUT in each column, functions as a source follower amplifier. In (b) of FIG. 7, the waveform F1 indicated by the solid line represents variation of the potential $V_{INT}$ in a non-touched state. The waveform F3 indicated by the broken line represents variation of the potential $V_{INT}$ in a touched state. Thus, the potential $V_{INT}$ of the accumulation node INT during the readout period varies depending on whether it is in a touched state or in a non-touched state. During the readout period, since the transistor M4 is conductive, a capacitance of the capacitor $C_{LC}$ upon readout is reflected on the voltage $V_{INT}$ of the accumulation node INT. As a result, the sensor output voltage $V_{PIX}$ from the transistor M2 has a value corresponding to the capacitance of the capacitor $C_{LC}$ upon readout.

4. Structure of Sensor Circuit

Figure 8:
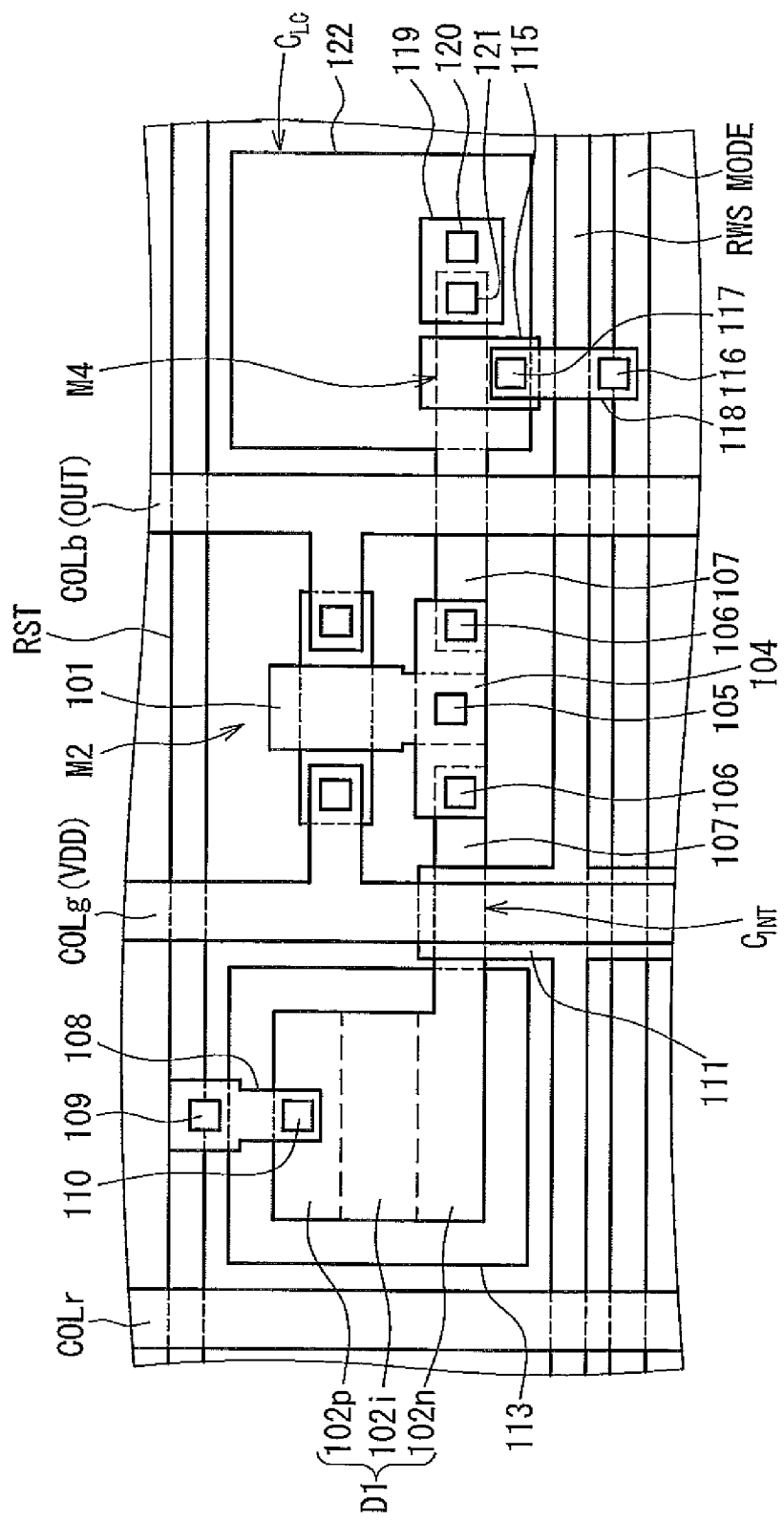
FIG. 8 is a plan view showing an exemplary planar structure of a sensor circuit according to one embodiment of the present invention.

FIG. 8 shows an exemplary structure of a sensor circuit according to the present embodiment. As shown in FIG. 8, this sensor circuit is formed on an active matrix substrate, and includes a transistor M2 provided in a region between the source lines COLg and COLb. A photodiode D1 is a PIN diode having a lateral structure in which a p-type semiconductor region 102p, an i-type semiconductor region 102i, and an n-type semiconductor region 102n are formed in series in a silicon film as a base. The p-type semiconductor region 102p functions as an anode of the photodiode D1, and is connected to a line RST via a line 108 and contact holes 109 and 110. The n-type semiconductor region 102n functions as a cathode of the photodiode D1, and is connected to a gate electrode 101 of the transistor M2 via an extended portion 107 of the silicon film, contacts 105 and 106, and a line 104.

In this configuration, lines RST and RWS are formed with the same metal as the metal of the gate electrode 101 of the transistor M2, and on the same layer through the same process as the layer and the process for the gate electrode 101. Besides, the lines 104, 108, 118, and 119 are formed with the same metal as the metal of the source line COL, and on the same layer through the same process as those for the source line COL. On the backside of the photodiode D1, a light shielding film 113 for preventing backlight from being incident on the photodiode D1 is provided.

Further, as shown in FIG. 8, the capacitor $C_{INT}$ is formed with a wide portion 111 formed in the line RWS, the extended portion 107 of the silicon film forming the n-type semiconductor region 102n, and an insulation film (not shown) provided between the wide portion 111 and the extended portion 107. In other words, the wide portion 111 having substantially the same potential as that of the line RWS functions as one of electrodes of the capacitor $C_{INT}$.

Further, the transistor M4 is formed in a region between the extended portion 107 of the silicon film connected to the contact 106 and the line 119. The line MODE is connected to a gate electrode 115 of the transistor M4 via a line 118 and contact holes 116 and 117. The capacitor $C_{LC}$ is formed with an ITO 122 shown in FIG. 8 and a counter ITO (not shown) opposed to the ITO 122. The counter ITO is formed over an entirety of the surface of the active matrix substrate. Here, the counter ITO is equivalent to a counter electrode. The ITO 122 shown in FIG. 8 is connected to a source electrode of the transistor M4 via the line 119 and contact holes 120 and 121.

5. Summary of Embodiment

As has been described so far, by controlling the transistor M4 by controlling the mode control signal supplied to the line MODE, the optical sensor function based on the photodiode D1 and the touch sensor function based on the variable capacitor $C_{LC}$ can be used selectively. The selective use of the optical sensor function and the touch sensor function makes it possible to select a function corresponding to an application displayed on the display apparatus. Thus, when the apparatus is used as an imager, the output does not vary even upon application of an inadvertent pressure. Further, a pressure detection by the liquid crystal capacitance and an output of the optical sensor can be distinguished from each other, whereby the detection of a feather touch and the detection of a pressure application can be realized at the same time.

The configurations explained in the description of the embodiment merely show specific examples, and do not limit the configuration of the present invention. Any arbitrary configuration may be employed as long as the effects of the present invention are achieved. It should be noted that the above-described configurations of the present embodiment may be applied to anything other than a display apparatus.

For example, in the foregoing description of the embodiment, the configuration is shown in which the source lines COL are utilized also as the lines VDD and the lines OUT connected to the sensor circuits. This configuration has an advantage that a high pixel aperture ratio is provided. However, with a configuration in which the lines VDD and the lines OUT for the optical sensors are provided separately from the source lines COL, the same effect can be achieved as the effect of the above-described embodiment. Further, in the above description of the embodiment, the touch-panel-equipped liquid crystal display device is explained, but the configuration of the present embodiment can be applied to a device that does not have a display function but has only a sensor function.

The present invention is useful as a display apparatus having sensor circuits in a pixel region of an active matrix substrate.

The invention claimed is:
1. A sensor circuit comprising:
   a photodetecting element that receives incident light;
   an accumulation part that is connected to the photodetecting element via an accumulation node and accumulates charges according to an electric current having flown through the photodetecting element;
   a reset signal line to which a reset signal for initializing a potential of the accumulation node is supplied;
   a readout signal line to which a readout signal for outputting the potential of the accumulation node is supplied;
   a sensor switching element that is connected to between the accumulation node and an output line, so as to make the accumulation node and the output line conductive with each other in response to the readout signal, and to output an output signal according to the potential of the accumulation node to the output line;
   a variable capacitor that is provided between the accumulation node and an input electrode to which a voltage is input, and whose capacitance varies when a pressure is applied; and a control switching element that is connected to the variable capacitor and the accumulation node, and has a control electrode to which a control signal for switching conduction and non-conduction between the variable capacitor and the accumulation node is input.

2. A sensor circuit comprising:

a photodetecting element that receives incident light;

an accumulation part that accumulates a potential according to an electric current having flown through the photodetecting element, in an accumulation node;

a reset signal line to which a reset signal for initializing a potential of the accumulation node is supplied;

a readout signal line to which a readout signal for reading out the potential of the accumulation node is supplied;

a sensor switching element that reads out the potential of the accumulation node in response to the readout signal and outputs an output signal according to the potential;

a variable capacitor whose capacitance varies with a pressure applied thereto; and a control switching element that controls conduction and non-conduction between the variable capacitor and the accumulation node, wherein the sensor circuit operates in at least two operation modes among an imager mode, a touch mode, and a hybrid mode, wherein in the imager mode, the potential of the accumulation node depends on an electric current that has flown through the photodetecting element during a period from the initialization by the reset signal to the readout in response to the readout signal, in the touch mode, the potential of the accumulation node depends on a capacitance of the variable capacitor upon the readout, and in the hybrid mode, the potential of the accumulation node depends on both of the electric current having flown through the photodetecting element and the capacitance of the variable capacitor.

3. The sensor circuit according to claim 2, wherein in the imager mode, a voltage of the reset signal is set so that charges according to the electric current having flown through the photodetecting element are accumulated in the accumulation part during the period from the initialization of the accumulation node by the reset signal to the readout in response to the readout signal, and the control switching element is controlled so that it is non-conductive at least upon the readout.

4. The sensor circuit according to claim 2, wherein in the touch mode, a voltage of the reset signal is set so that the accumulation node assumes an initialized state upon the readout, and the control switching element is controlled so that it is conductive upon the readout.

5. The sensor circuit according to claim 2, wherein in the hybrid mode, the control switching element is controlled so that the control switching element is conductive upon the readout, a voltage of the reset signal is set so that charges according to the electric current having flown through the photodetecting element are accumulated in the accumulation part during the period from the initialization of the accumulation node by the reset signal to the readout in response to the readout signal, and in the case where the variable capacitor is made conductive with the accumulation node by the control switching element upon the readout, a voltage is applied to the variable capacitor so that the accumulation node has a predetermined voltage.

6. A display apparatus comprising:

an active matrix substrate having a pixel region;

a counter substrate, and the sensor circuit according to claim 1 provided in the pixel region of the active matrix substrate.

7. A display apparatus comprising:

an active matrix substrate having a pixel region;

a counter substrate, and the sensor circuit according to claim 2 provided in the pixel region of the active matrix substrate.

* * * * *